(12) United States Patent
Kim

(10) Patent No.: US 10,966,313 B2
(45) Date of Patent: Mar. 30, 2021

(54) METHOD FOR MANUFACTURING PRINTED CIRCUIT BOARD HAVING TEST POINT, AND PRINTED CIRCUIT BOARD MANUFACTURED THEREBY

(71) Applicant: LG Chem, Ltd., Seoul (KR)

(72) Inventor: Jeong Wan Kim, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/629,630

(22) PCT Filed: Jan. 30, 2019

(86) PCT No.: PCT/KR2019/001250
§ 371 (c)(1),
(2) Date: Jan. 9, 2020

(87) PCT Pub. No.: WO2019/151752
PCT Pub. Date: Aug. 8, 2019

(65) Prior Publication Data
US 2020/0170104 A1 May 28, 2020

(30) Foreign Application Priority Data
Jan. 30, 2018 (KR) .................. 10-2018-0011171

(51) Int. Cl.
*H05K 1/02* (2006.01)
*H05K 3/40* (2006.01)
(Continued)

(52) U.S. Cl.
CPC .......... *H05K 1/0268* (2013.01); *H01R 12/55* (2013.01); *H05K 1/111* (2013.01); *H05K 3/00* (2013.01); *H05K 3/4007* (2013.01)

(58) Field of Classification Search
CPC .. H05K 1/0268; H05K 1/0266; H05K 1/0269; H05K 1/0296; H05K 1/181; H05K 3/4007; H05K 3/4015; H05K 3/403
See application file for complete search history.

(56) References Cited

U.S. PATENT DOCUMENTS 5,923,047 A * 7/1999 Chia ................. H01L 22/32
257/48
8,008,584 B2 * 8/2011 Tu ..................... G09G 3/006
174/260

(Continued)

FOREIGN PATENT DOCUMENTS

| JP | H02120918 A | 5/1990 |
| JP | 3007181 U | 2/1995 |

(Continued)

OTHER PUBLICATIONS

ISR for Application PCT/KR2019/001250 dated May 20, 2019.
European Search Report for EP19747247.5 dated Jan. 18, 2021; 2 pages.

*Primary Examiner* — Jeremy C Norris
(74) *Attorney, Agent, or Firm* — Lerner, David, Littenberg, Krumholz & Mentlik, LLP

(57) ABSTRACT

Provided is a method of manufacturing a printed circuit board having test points in which test points and pads are formed on the printed circuit board and then are electrically connected to each other, so that it is possible to form the pads having a pitch interval smaller than that in the related art. This may contribute to miniaturization of the printed circuit board by mounting a connector smaller than that in the related art on the printed circuit board, and may enable the preformed test points to be used as they are even after the connector used is removed from the printed circuit board. Also provided is a printed circuit board manufactured thereby.

16 Claims, 3 Drawing Sheets

(51) Int. Cl.
  *H01R 12/55*  (2011.01)
  *H05K 1/11*  (2006.01)
  *H05K 3/00*  (2006.01)

(56) References Cited

U.S. PATENT DOCUMENTS

| | | | |
|---|---|---|---|
| 9,173,293 | B2 | 10/2015 | Nagahara et al. |
| 2003/0042618 | A1* | 3/2003 | Nose ................ H01L 22/32 257/778 |
| 2004/0257103 | A1 | 12/2004 | Park et al. |
| 2012/0032698 | A1 | 2/2012 | Su |

FOREIGN PATENT DOCUMENTS

| | | |
|---|---|---|
| JP | H08136601 A | 5/1996 |
| JP | H0992365 A | 4/1997 |
| JP | H10190181 A | 7/1998 |
| JP | H10339744 A | 12/1998 |
| JP | H11251706 A | 9/1999 |
| JP | 2001042011 A | 2/2001 |
| JP | 2002299805 A | 10/2002 |
| KR | 19980064729 U | 3/2000 |
| KR | 20040110033 A | 12/2004 |
| KR | 20070065152 A | 6/2007 |
| KR | 20140134812 A | 11/2014 |
| KR | 20170020002 A | 2/2017 |

\* cited by examiner

[Figure 1]
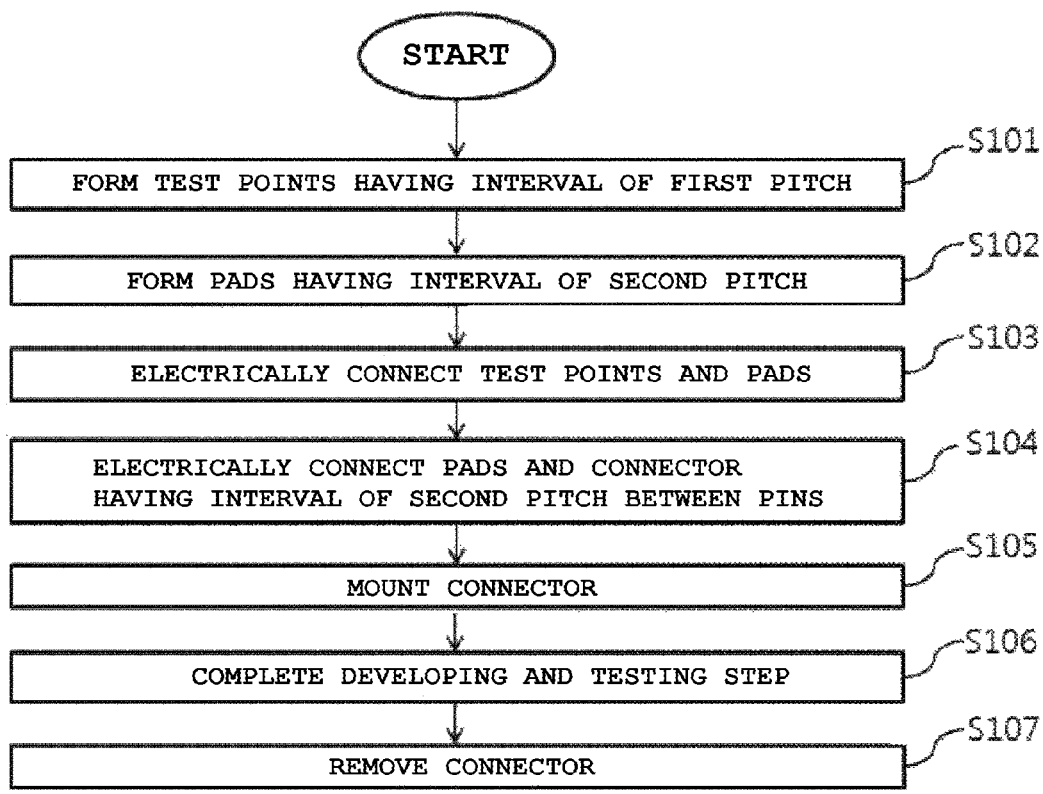

[Figure 2]
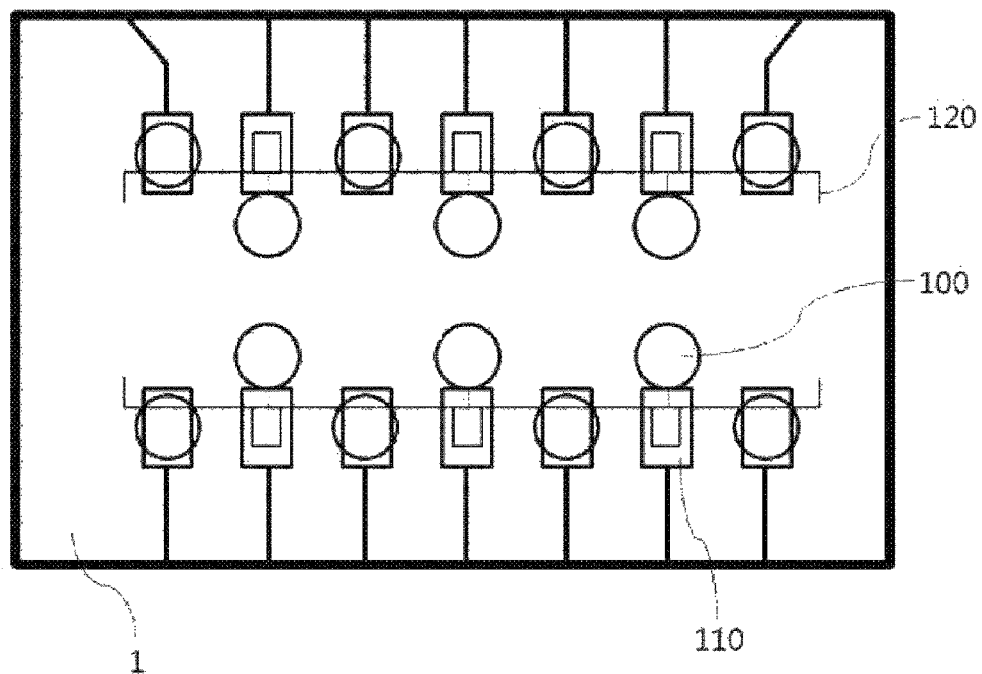
[Figure 3]
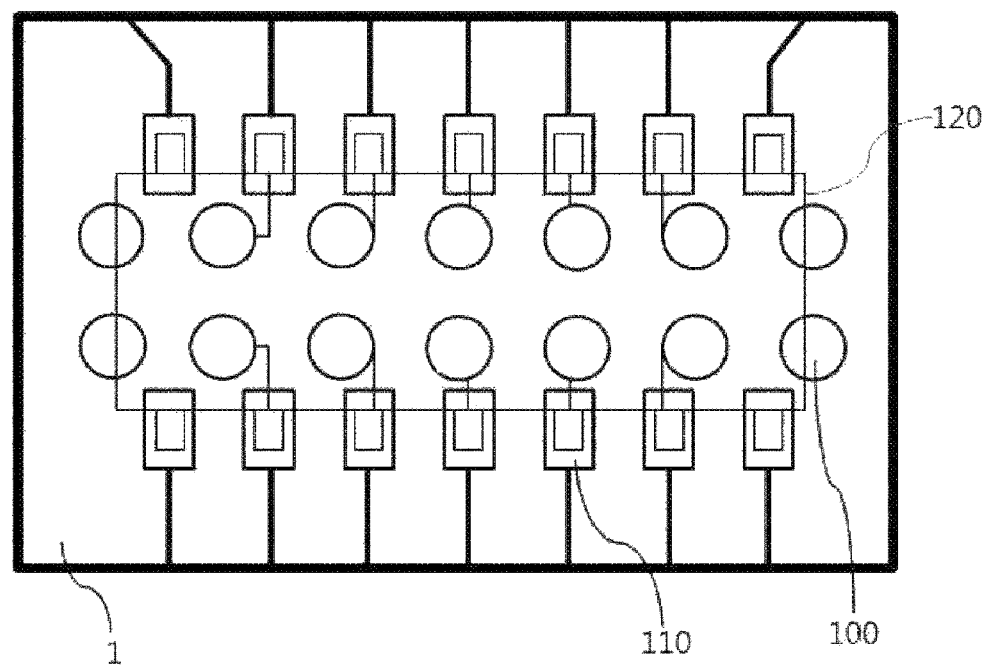

[Figure 4]
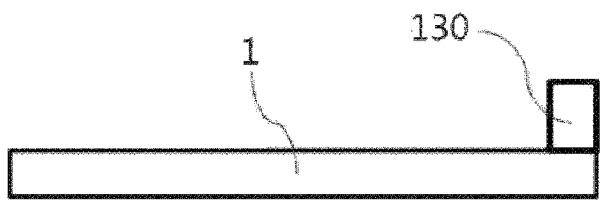

US 10,966,313 B2

METHOD FOR MANUFACTURING PRINTED CIRCUIT BOARD HAVING TEST POINT, AND PRINTED CIRCUIT BOARD MANUFACTURED THEREBY

CROSS-REFERENCE TO RELATED APPLICATIONS

The present application is a national phase entry under 35 U.S.C. § 371 of International Application No. PCT/KR2019/001250 filed Jan. 30, 2019, published in Korean, which claims priority from Korean Patent Application No. 10-2018-0011171 filed Jan. 30, 2018, all of which are incorporated herein by reference.

TECHNICAL FIELD

The present invention relates to a method of manufacturing a printed circuit board having test points and a printed circuit board manufactured thereby, and more particularly, to a method of manufacturing a printed circuit board having test points in which test points and pads are formed on the printed circuit board and then are electrically connected to each other, so that it is possible to form the pads having a pitch interval smaller than that in the related art. This may contribute to miniaturization of the printed circuit board by mounting a connector smaller than that in the related art on the printed circuit board, and may enable the preformed test points to be used as they are even after the connector used is removed from the printed circuit board. Also provided is a printed circuit board manufactured thereby.

BACKGROUND ART

A printed circuit board is a board, in which parts of an electronic circuit are mounted, and is generally manufactured by a printing method of printing wiring along a circuit pattern, and other portions except for the printed region are etched.

Such a printed circuit board may have various problems such as a defect of an element itself mounted on the printed circuit board, improper mounting of the element, or inaccurate pattern printing on the printed circuit board.

A specific test part having a measuring terminal drawn out to repair and inspect the printed circuit board in order to solve the above problems is called a test point.

In the conventional process of the related art, instead of separately forming test points on a printed circuit board, a hole type connector is used on a pad formed on the printed circuit board, and then the hole of the pad remaining in a place where the connector is removed is electrically connected with a jig and used as a test point to perform an additional process such as a test.

However, when the connector used in the printed circuit board occupies a large space of the printed circuit board, the size of the printed circuit board itself is inevitably increased. When a connector smaller than that in the related art is used to reduce the size of the printed circuit board, the holes remaining after removing the connector do not fit into a pitch interval of the jig in the related art, and thus cannot be used as test points. Accordingly, in order to use the holes as the test points, it is necessary to separately produce a jig fitting into the pitch interval of the connector smaller than that in the related art. However, in this case, since holes between the pins of the jig electrically connected to the test points become too close, the jig may be damaged while the holes are drilled at the time of producing the jig, and since a pin thickness of the jig is reduced, there is a problem in that the jig may warp or become damaged when a test is performed. In addition, when a connector smaller than that in the related art is used, a conventional jig in the related art cannot be used. For this reason, only when test points fitting into a pitch size of the jig in the related art are separately formed near the connector, even after removing the connector, may the test points be used with the jig in the related art. In such a case, it is meaningless to miniaturize the connector because the space of the printed circuit board occupied by the connector smaller than that in the related art and the test points fitting into the pitch size of the jig in the related art does not greatly differ from the space of the printed circuit board occupied by the connector in the related art. For this reason, the connector smaller than that in the related art cannot be used in the case of a task requiring a mass production process.

Technical Problem

The present invention is conceived to solve the foregoing problems, and has been made in an effort to provide a method of manufacturing a printed circuit board having test points in which test points and pads are formed on the printed circuit board and then are electrically connected to each other, so that it is possible to form the pads having a pitch interval smaller than that in the related art. This may contribute to miniaturization of the printed circuit board by mounting a connector smaller than that in the related art on the printed circuit board, and may enable the preformed test points to be used as they are even after the connector is removed from the printed circuit board. A printed circuit board manufactured thereby is also provided.

Technical Solution

An exemplary embodiment of the present invention provides a method of manufacturing a printed circuit board having test points, the method including: forming a plurality of test points having a first pitch interval on an upper side of the printed circuit board; forming a plurality of pads having a second pitch interval at positions adjacent to the one or more test points; and electrically connecting the plurality of test points to corresponding ones of the plurality of pads, respectively.

In the exemplary embodiment, the second pitch interval may be smaller than the first pitch interval.

In the exemplary embodiment, the first pitch interval may be 1.6 mm, and the second pitch interval may be between 1 mm to 1.27 mm.

In the exemplary embodiment, the first pitch interval may be 1.6 mm, and the second pitch interval may be 1.27 mm.

In the exemplary embodiment, the method may further include mounting a connector on the printed circuit board, in which the connector may include a plurality of pins that are electrically connected to corresponding ones of the plurality of pads, respectively, and a pin spacing of the connector may be equal to the second pitch interval.

In the exemplary embodiment, the method may include removing the mounted connector from the printed circuit board.

In the exemplary embodiment, forming the plurality of test points may include arranging the plurality of test points to be staggered in a zigzag pattern while maintaining the first pitch interval between each pair of adjacent test points.

In the exemplary embodiment, forming the plurality of test points may include arranging the plurality of test points to be positioned along one or more straight lines while maintaining the first pitch interval.

Another exemplary embodiment of the present invention provides a printed circuit board having: a plurality of test points formed on an upper side of the printed circuit board and having a first pitch interval; a plurality of pads formed at positions adjacent to the plurality of test points and having a second pitch interval; and an electrical connection through which the plurality of test points are electrically connected to corresponding ones of the plurality of pads, respectively.

In the exemplary embodiment, the second pitch interval may be smaller than the first pitch interval.

In the exemplary embodiment, the first pitch interval may be 1.6 mm, and the second pitch interval may be 1 mm to 1.27 mm.

In the exemplary embodiment, the first pitch interval may be 1.6 mm, and the second pitch interval may be 1.27 mm.

In the exemplary embodiment, the printed circuit board may further include a connector mounted on the printed circuit board, the connector may include a plurality of pins that may be electrically connected with corresponding ones of the plurality of pads, respectively, and a pin spacing of the connector may be equal to the second pitch interval.

In the exemplary embodiment, the mounted connector may be configured to be removable from the printed circuit board.

In the exemplary embodiment, the plurality of test points may be arranged to be staggered in a zigzag pattern while maintaining the first pitch interval between each pair of adjacent test points.

In the exemplary embodiment, the plurality of test points may be arranged to be positioned along one or more straight lines while maintaining the first pitch interval between each pair of adjacent test points.

Advantageous Effects

According to an aspect of the present invention, it is possible to provide a method of manufacturing a printed circuit board having test points in which test points and pads are formed on the printed circuit board and then are electrically connected to each other, thereby forming the pads having a pitch interval smaller than that in the related art. This may contribute to miniaturization of the printed circuit board by mounting a connector smaller than that in the related art on the printed circuit board, and to enabling the preformed test points to be used as they are even after the connector used is removed from the printed circuit board. A printed circuit board manufactured thereby is also provided.

BRIEF DESCRIPTION OF DRAWINGS

FIG. 1 is a flowchart illustrating a process for manufacturing a printed circuit board having test points according to an exemplary embodiment of the present invention in a sequential order.

FIG. 2 is a view illustrating test points arranged to be staggered in a diagonal direction on a printed circuit board according to an exemplary embodiment of the present invention.

FIG. 3 is a view illustrating test points arranged in a rectilinear direction on a printed circuit board according to an exemplary embodiment of the present invention.

FIG. 4 is a view schematically illustrating a connector mounted on the printed circuit board according to an exemplary embodiment of the present invention.

DETAILED DESCRIPTION

Hereinafter, exemplary embodiments will be suggested for helping to understand the present invention. However, the following exemplary embodiments are provided only to more easily understand the present invention, and the contents of the present invention are not limited by the exemplary embodiments.

FIG. 1 is a flowchart illustrating a process for manufacturing a printed circuit board having test points according to an exemplary embodiment of the present invention in a sequential order.

Referring to FIG. 1, first, one or more test points having a first pitch interval are formed at an upper side of a printed circuit board (S101).

Here, "pitch interval" may mean a distance of an interval when things having the same shape are repeatedly arranged at the same interval. For example, the pitch may mean a distance between adjacent sawteeth of a saw-toothed wheel or a distance between adjacent screw threads of a screw. Further, an "interval" may be any one of a distance between adjacent test points, a distance between adjacent pads, a distance between adjacent holes of a connector, a distance between adjacent pins of an adapter, and the like.

According to an exemplary embodiment, the first pitch for forming the test points having the minimum pitch depending on the minimum diameter of the test point and the minimum distance between the test points may correspond to a pitch of 1.6 mm. The first pitch interval, or interval of the first pitch, may vary depending on the minimum diameter of the test point and the minimum interval between the test points. For example, when the minimum diameter of the test point is 1.2 mm and the minimum interval is 0.4 mm, the first-pitch interval of the test points is 1.6 mm. Further, when a jig having an interval of the minimum pitch is used, the first pitch may correspond to a pitch of 1.6 mm. After the connector used in the printed circuit board in a step of developing the printed circuit board is removed, an additional process is performed by electrically connecting the jig to the test points, so that the interval of the first pitch may vary depending on a pitch interval of the jig having the minimum-pitch interval. The jig having the minimum-pitch interval may mean a jig having the smallest pitch interval that would prevent the jig from being damaged while the holes are drilled in the jig at the time of producing the jig, or that would prevent the jig from warping or being damaged at the time of performing a test due to a decrease in a pin thickness of the jig. Further, the one or more test points may be one or more specific test portions for repairing and inspecting a printed circuit board, an element or a pattern of the printed circuit board, and the like. The one or more test points may be arranged to be staggered in a diagonal or oblique direction, or zigzag pattern, while maintaining the interval of the first pitch, or may be arranged to be positioned in series along one or more straight lines. The printed circuit board may be one applied to a field of an automotive battery management system (BMS).

Here, the diagonal direction may mean a line that is not perpendicular to a plane or that is not a straight line. For example, the diagonal direction may refer to a zigzag pattern in which multiple test points positioned to have the interval of the first pitch are arranged at a regular interval and connected along a line repeatedly bent at a predetermined angle (for example, 60 degrees) instead of being positioned along a straight line, and the test points arranged in the diagonal or oblique direction, or zigzag pattern, may have the same shapes on the upper and lower sides, or the left and right sides like decalcomanie.

Further, the configuration in which the one or more test points are arranged to be positioned in series along the one or more straight lines may mean a configuration in which the test points are formed at the first pitch interval and particularly located on a straight line, and the test points arranged to be positioned on the straight line in this way may have the same shapes on the upper and lower sides, or the left and right sides like decalcomanie.

Next, one or more pads having an a second pitch interval are formed at positions adjacent to the one or more test points (S102).

Here, being adjacent may mean being side by side or close to each other, or having the boundaries in contact with each other.

The second pitch interval may be smaller than the first pitch interval so as to mount a connector having the minimum size on the printed circuit board. There is a limitation in minimizing a pitch interval of a jig in terms of process technology, and thus, the interval of the minimum pitch of the test points formed on the printed circuit board may be determined according to the minimum pitch interval of the jig. For example, when the minimum pitch interval of the jig is 1.6 mm, the minimum pitch interval of the test points may also be a pitch of 1.6 mm. In the process procedure in the related art, instead of separately forming the test points on the printed circuit board, after the hole type connector is used on the pads formed on the printed circuit board, the holes of the pads remaining in a place where the connector is removed are electrically connected with the jig and used as the test points to perform the additional process such as a test. As described above, the minimum pitch interval of the jigs is associated with the pitch interval of the pads, and as a result, it is impossible to use a connector having an interval equal to or smaller than the pitch interval of the jig. However, by forming the one or more test points on the printed circuit board and electrically connecting the one or more test points with the one or more pads, the separately formed test points are used after removing the connector, so that the pitch interval of the pads may be independent from the pitch interval of the jig, and as a result, it is possible to use the connector having an interval equal to or smaller than the minimum pitch interval of the jig. Further, in the case where the first pitch of the test points is formed to have a pitch of 1.6 mm and the second pitch of the pads is formed to have a pitch of 2.54 mm larger than the first pitch or a pitch of 1.27 mm smaller than the first pitch, according to the comparison result of areas of the connectors used in the printed circuit board after the connectors are connected to the pads, the connector having the pitch of 2.54 mm occupies an area about three times as much as that of the connector having the pitch of 1.27 mm, so that the second pitch having a pitch interval smaller than the first pitch interval may be effective in achieving the object of miniaturization of the printed circuit board. For example, the second pitch for using a connector smaller than the connector in the related art in the printed circuit board may be between 1 mm to 1.27 mm.

Further, the one or more pads may mean one or more metal plate films that are coated around holes into which parts are inserted when an element and the like mounted on the printed circuit board are inserted into the printed circuit board, may be used for attachment or electrical connection of the printed circuit board and the element and the like, and may also be used for the purpose of testing and the like.

Next, after steps S101 and S102, the one or more test points are electrically connected to the one or more pads, respectively (S103).

Here, the electrical connection may mean that the connected element or device and the like are allowed to transmit an electrical signal. Further, the transmission of the electrical signal may mean that necessary software and the like may be downloaded or uploaded to the printed circuit board. In addition, the transmission of the electrical signal may mean that it is possible to determine whether the element and the like mounted on the printed circuit board have a defect, the element or the like are properly mounted on the printed circuit board, a pattern is accurately printed on the printed circuit board, and the like.

Next, the pads are electrically connected with the connector having a pin interval equal to the second pitch (S104).

Here, the connector may refer to an element connected to the pads and the test points of the printed circuit board. This allows the device or element and the like connected to the connector and the printed circuit board to transmit electrical signals to each other. It is possible to download or upload necessary software to the printed circuit board with electrical signals transmitted by connecting another element or device through the element. In addition, it is possible to determine whether the element and the like mounted on the printed circuit board have a defect, the element and the like are properly mounted, the pattern is accurately printed on the printed circuit board, and the like.

Next, the connector is mounted on the printed circuit board (S105).

Here, the connector may be mounted to be removable from the printed circuit board later. The configuration in which the connector is mounted to be removable may mean, for example, a configuration in which the connector may be easily removed later due to weak coupling during soldering, and mean a configuration in which a mounting portion or provisional mounting portion is provided at the mounting position of the connector so that the connector is fixed on the printed circuit board.

Next, a step of developing and testing the printed circuit board is performed (S106).

Here, the developing and testing step may be a step of downloading or uploading necessary software and the like to the printed circuit board. In addition, the developing and testing step may be a step of determining whether the element and the like mounted on the printed circuit board have a defect, the element and the like are properly mounted, the pattern is accurately printed on the printed circuit board, and the like.

Next, when the step of developing and testing the printed circuit board is completed, the connector is removed, and when the developing and testing step is not completed, the printed circuit board is subjected to the developing and testing step again (S107).

Here, the configuration in which the connector is removed may mean a configuration in which the printed circuit board returns to the state before the connector is mounted without damage to the test points and the pads, the printed circuit pattern, the element, and the like on the printed circuit board. In addition, even after the connector is removed, the printed circuit board may be tested and the software and the like may be downloaded or uploaded to the printed circuit board by using a jig according to the pitch size of the test points because the test points and the pads are electrically connected. Further, it is possible to determine whether the element and the like mounted on the printed circuit board have a defect, the element and the like are properly mounted, the pattern is accurately printed on the printed circuit board, and the like.

Here, the jig may be a device that is electrically connected to the one or more test points after removing the connector on the printed circuit board to download or upload necessary software and the like to the printed circuit board, test the printed circuit board, and the like.

Next, the configuration of the printed circuit board manufactured by the manufacturing process described above will be described in more detail with reference to FIGS. 2 to 4.

FIG. 2 is a view illustrating test points arranged to be staggered in a diagonal or oblique direction, or a zigzag pattern, on a printed circuit board according to an exemplary embodiment of the present invention, FIG. 3 is a view illustrating test points arranged in a straight direction on a printed circuit board according to an exemplary embodiment of the present invention, and FIG. 4 is a view schematically illustrating a connector mounted on the printed circuit board according to an exemplary embodiment of the present invention.

Referring to FIGS. 2 to 4, a printed circuit board 1 having test points according to an exemplary embodiment of the present invention may generally include one or more test points 100, one or more pads 110, and a connection part 120. Further, the exemplary embodiment may additionally include a connector 130.

The printed circuit board 1 is a board, in which metal wires are thinly printed, and may mean a board that is provided such that various elements, such as a semiconductor, a condenser, and a resistor, may be inserted into the printed circuit board, and thus serves to connect the elements and the like through the metal wires.

The one or more test points 100 may be one or more specific test portions for repairing and inspecting the printed circuit board 1. Further, the one or more test points 100 may be electrically connected to the one or more pads 110, which will be described below, through the connection part 120. Further, the one or more test points 100 may be used for downloading or uploading necessary software and the like to the printed circuit board 1 and testing the printed circuit board 1 even after performing the step of developing and testing the printed circuit board and removing the connector 130.

The one or more pads 110 may be used for attachment or electrical connection of the printed circuit board 1 and an element and the like and may also be used for the purpose of testing and the like.

The connection part 120 may serve to electrically connect the one or more test points 100 to the one or more pads 110. The one or more test points 100 may be electrically connected to the one or more pads 110 through the connection part 120, thereby transmitting an electric signal to the printed circuit board 1.

The connector 130 is connected to the one or more pads 110 and the one or more test points 100 of the printed circuit board 1 to serve to transmit electrical signals between the printed circuit board 1 and other devices connected to the connector.

Referring to FIG. 2, the one or more test points 100 may be arranged to be staggered in a diagonal or oblique direction, or zigzag pattern, while maintaining a first pitch interval, and may be electrically connected to the one or more pads 110 formed to have an a second pitch interval and to be positioned at positions adjacent to the one or more test points 100 through the connection part 120. Herein, the second pitch interval may be smaller than the first pitch interval. For example, the first pitch interval may be 1.6 mm, and the second pitch interval may be between 1 mm to 1.27 mm.

Referring to FIG. 3, the one or more test points 100 may be arranged to be positioned in series on one or more straight lines while maintaining the first pitch interval, and may be electrically connected to the one or more pads 110 formed to have a pitch interval equal to the second pitch interval, and to be positioned at positions adjacent to the one or more test points 100 through the connection part 120.

Referring to FIG. 4, after the connection part through which the one or more test points are electrically connected to the one or more pads is formed on the printed circuit board 1, the connector 130 electrically connected to the one or more pads may be mounted on the printed circuit board 1. The connector 130 may be mounted to be removable from the printed circuit board later. Referring to FIG. 4, it can be seen that the connector 130 protrudes in a direction of one side (for example, an upper surface, a lower surface, or a side portion) of the printed circuit board 1. In this case, the connector 130 may be formed to have a height at which a pin terminal may be easily inserted.

In the forgoing, the present invention has been described with reference to the exemplary embodiments of the present invention, but those skilled in the art may appreciate that the present invention may be variously corrected and changed without departing from the spirit and the area of the present invention described in the appending claims.

The invention claimed is:

1. A printed circuit board having test points comprising:
   the printed circuit board:
   a plurality of test points formed on an upper side of the printed circuit board and having a first pitch interval;
   a plurality of pads formed on the printed circuit board and having a second pitch interval, wherein the plurality of test points and the plurality of pads are equal in number, wherein each one of the plurality of pads is formed at a position adjacent to a corresponding one of the plurality of test points, and wherein the second pitch interval is different than the first pitch interval; and
   an electrical connection through which the plurality of test points are electrically connected to corresponding ones of the plurality of pads, respectively.

2. The method of claim 1, wherein the second pitch interval is smaller than the first pitch interval.

3. The method of claim 1, wherein the first pitch interval is 1.6 mm, and the second pitch interval is between 1 mm to 1.27 mm.

4. The printed circuit board of claim 3, wherein the second pitch interval is 1.27 mm.

5. The printed circuit board of claim 1, further comprising:
   a connector mounted on the printed circuit board, wherein the connector includes a plurality of pins that are electrically connected with corresponding ones of the plurality of pads, respectively, and wherein a pin spacing of the connector is equal to the second pitch interval.

6. The printed circuit board of claim 5, wherein the mounted connector is configured to be removable from the printed circuit board.

7. The printed circuit board of claim 1, wherein the plurality of test points are arranged to be staggered in a zigzag pattern while maintaining the first pitch interval between each pair of adjacent test points.

8. The printed circuit board of claim 1, wherein the plurality of test points are arranged to be positioned along one or more straight lines while maintaining the first pitch interval between each pair of adjacent test points.

9. A method of manufacturing a printed circuit board having test points, the method comprising:
   forming a plurality of test points having a first pitch interval on an upper side of the printed circuit board;
   forming a plurality of pads having a second pitch interval on the printed circuit board, wherein the plurality of test points and the plurality of pads are equal in number, wherein each one of the plurality of pads is formed at a position adjacent to a corresponding one of the plurality of test points, wherein the second pitch interval is different from the first pitch interval; and
   electrically connecting the plurality of test points to corresponding ones of the plurality of pads, respectively.

10. The method of claim 9, wherein the second pitch interval is smaller than the first pitch interval.

11. The method of claim 9, wherein the first pitch interval is 1.6 mm, and the second pitch interval is between 1 mm to 1.27 mm.

12. The method of claim 11, wherein the second pitch interval is 1.27 mm.

13. The method of claim 9, further comprising:
   mounting a connector on the printed circuit board, wherein the connector includes a plurality of pins that are electrically connected to corresponding ones of the plurality of pads, respectively, and wherein a pin spacing of the connector is equal to the second pitch interval.

14. The method of claim 13, comprising:
   removing the mounted connector from the printed circuit board.

15. The method of claim 9, wherein forming the plurality of test points includes arranging the plurality of test points to be staggered in a zigzag pattern while maintaining the first pitch interval between each pair of adjacent test points.

16. The method of claim 9, wherein forming the plurality of test points includes arranging the plurality of test points to be positioned along one or more straight lines while maintaining the first pitch interval between each pair of adjacent test points.

* * * * *